(12) United States Patent
Kim et al.

(10) Patent No.: US 10,177,100 B2
(45) Date of Patent: Jan. 8, 2019

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Moon Il Kim, Suwon-si (KR); Mi Jin Choi, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/655,668

(22) Filed: Jul. 20, 2017

(65) Prior Publication Data

US 2018/0145036 A1    May 24, 2018

(30) Foreign Application Priority Data

Nov. 23, 2016   (KR) .......................... 10-2016-0156793

(51) Int. Cl.
*H01L 23/00*     (2006.01)
*H01L 23/29*     (2006.01)
(Continued)

(52) U.S. Cl.
CPC .......... *H01L 23/562* (2013.01); *H01L 23/295* (2013.01); *H01L 23/3114* (2013.01);
(Continued)

(58) Field of Classification Search
CPC . H01L 23/562; H01L 23/295; H01L 23/3114; H01L 23/5383; H01L 23/5384; H01L 23/5386; H01L 23/5389
See application file for complete search history.

(56) References Cited

U.S. PATENT DOCUMENTS 9,853,003 B1 * 12/2017 Han ...................... H01L 23/645
2012/0013021 A1   1/2012 Kobayashi et al.
(Continued)

FOREIGN PATENT DOCUMENTS

CN    103168358 A    6/2013
JP    2012-039090 A  2/2012
(Continued)

OTHER PUBLICATIONS

Office Action issued in Taiwanese Patent Application No. 106124049, dated Jun. 12, 2018 (English translation).
(Continued)

*Primary Examiner* — Mark Prenty
(74) *Attorney, Agent, or Firm* — McDermott Will & Emery LLP

(57) ABSTRACT

A fan-out semiconductor package includes a first connection member having a through-hole, a semiconductor chip disposed in the through-hole of the first connection member, the semiconductor chip including an active surface having connection pads disposed thereon and an inactive surface opposing the active surface, a passive component attached to the active surface of the semiconductor chip, an encapsulant encapsulating at least a portion of the first connection member and the inactive surface of the semiconductor chip, and a second connection member disposed on the first connection member and the active surface of the semiconductor chip, the first connection member and the second connection member each including at least one redistribution layer electrically connected to the connection pads of the semiconductor chip, and the passive component being electrically connected to the connection pads of the semiconductor chip through the redistribution layer of the second connection member.

15 Claims, 12 Drawing Sheets

(51) Int. Cl.
*H01L 23/31* (2006.01)
*H01L 23/538* (2006.01)

(52) U.S. Cl.
CPC ...... *H01L 23/3128* (2013.01); *H01L 23/5383* (2013.01); *H01L 23/5384* (2013.01); *H01L 23/5386* (2013.01); *H01L 23/5389* (2013.01); *H01L 24/18* (2013.01)

(56) References Cited

U.S. PATENT DOCUMENTS

| | | |
|---|---|---|
| 2012/0241906 A1 | 9/2012 | Nakanishi |
| 2014/0063768 A1 | 3/2014 | Tanaka et al. |
| 2014/0182895 A1 | 7/2014 | Lee et al. |
| 2016/0043047 A1 | 2/2016 | Shim et al. |
| 2016/0218076 A1 | 7/2016 | Managaki et al. |
| 2016/0293581 A1 | 10/2016 | Lin et al. |

FOREIGN PATENT DOCUMENTS

| | | |
|---|---|---|
| JP | 2014-049476 A | 3/2014 |
| JP | 2016-139648 A | 8/2016 |
| KR | 10-2012-0113733 A | 10/2012 |
| KR | 10-2013-0132163 A | 12/2013 |
| TW | 201436660 A | 9/2014 |
| TW | 201441298 A | 11/2014 |
| TW | 201618196 A | 5/2016 |
| WO | 2012012338 A1 | 1/2012 |

OTHER PUBLICATIONS

Notice of Office Action issued in Korean Patent Application No. 10-2016-0156793, dated Nov. 12, 2018 (English translation).

\* cited by examiner

FAN-OUT SEMICONDUCTOR PACKAGE

CROSS-REFERENCE TO RELATED APPLICATION(S)

This application claims the benefit of priority to Korean Patent Application No. 10-2016-0156793, filed on Nov. 23, 2016 with the Korean Intellectual Property Office, the disclosure of which is incorporated herein by reference in its entirety.

TECHNICAL FIELD

The present disclosure relates to a semiconductor package, and more particularly, to a fan-out semiconductor package in which connection terminals extend outwardly of a region in which a semiconductor chip is disposed.

BACKGROUND

Recently, a significant trend in the development of technology related to semiconductor chips has been to reduce the size of semiconductor chips. Therefore, in the field of package technology, in accordance with a rapid increase in demand for small-sized semiconductor chips, the implementation of a semiconductor package having a compact size, while including a plurality of pins, has been demanded.

One type of package technology suggested to satisfy the technical demand as described above is a fan-out package. Such a fan-out package has a compact size and may allow a plurality of pins to be implemented by redistributing connection terminals outwardly of a region in which a semiconductor chip is disposed.

Recently, a technology for mounting various kinds of passive components such as a capacitor, and the like, on a lower surface of a fan-out semiconductor package in order to improve characteristics has been suggested. However, in this case, a limitation is generated in a space in which solder balls are mounted.

SUMMARY

An aspect of the present disclosure may provide a fan-out semiconductor package in which a sufficient number of connection terminals such as solder balls may be secured, in spite of including a passive component, a signal distance between a semiconductor chip and the passive component may be significantly reduced, and thinness is possible.

According to an aspect of the present disclosure, a fan-out semiconductor package may be provided, in which a passive component is attached to an active surface of a semiconductor chip on which connection pads are disposed and the semiconductor chip is then packaged.

According to an aspect of the present disclosure, a fan-out semiconductor package may include: a first connection member having a through-hole; a semiconductor chip disposed in the through-hole of the first connection member and having an active surface having connection pads disposed thereon and an inactive surface opposing the active surface; a passive component attached to the active surface of the semiconductor chip; an encapsulant encapsulating at least portions of the first connection member and the inactive surface of the semiconductor chip; and a second connection member disposed on the first connection member and the active surface of the semiconductor chip, wherein the first connection member and the second connection member respectively include redistribution layers electrically connected to the connection pads of the semiconductor chip, and the passive component is electrically connected to the connection pads of the semiconductor chip through the redistribution layer of the second connection member.

According to another aspect of the present disclosure, a fan-out semiconductor package may include: a semiconductor chip including a body having first and second surfaces opposing each other, connection pads disposed on the first surface of the body, and a passivation layer disposed on the first surface of the body and covering at least portions of the connection pads; an IPD including a body having third and fourth surfaces opposing each other and electrode pads disposed on the third surface; a DAF connecting the passivation layer of the semiconductor chip and the fourth surface of the IPD; an encapsulant encapsulating at least portions of the semiconductor chip; and a connection member disposed on the semiconductor chip and including a redistribution layer electrically connected to the connection pads of the semiconductor chip and the electrode pads of the IPD.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described with reference to the accompanying drawings. In the accompanying drawings, shapes, sizes and the like, of components may be exaggerated or altered for clarity.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction toward a mounted surface of the fan-out semiconductor package in relation to cross sections of the drawings. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" encompasses the concepts of a physical connection and a physical disconnection. It can be understood that when an element is referred to using terms such as "first" and "second", the element is not limited thereby. They may only be used for a purpose of distinguishing one element from other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein may not refer to the same exemplary embodiment, and is provided to emphasize a particular feature or characteristic different from that of another exemplary embodiment. However, exemplary embodiments provided herein are considered to be able to be implemented by being combined in whole or in part with one another. For example, one element described in a particular exemplary embodiment, even if it is not described in another exemplary embodiment, may be understood as a description related to another exemplary embodiment and can thus be used in conjunction with elements described in other exemplary embodiments, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
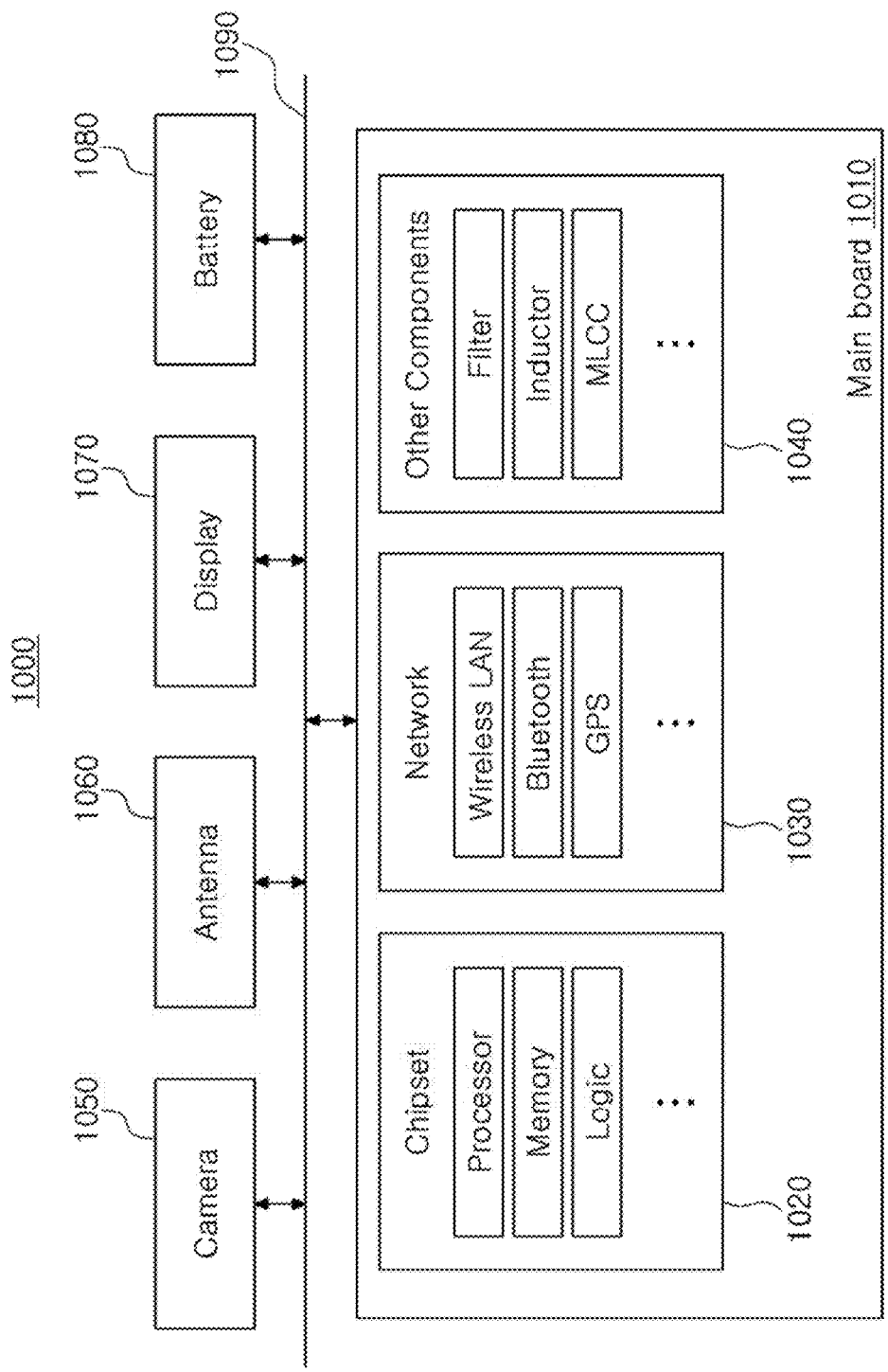
FIG. 1 is a schematic block diagram illustrating an example of an electronic device system according to exemplary embodiments of the present disclosure.

FIG. 1 is a schematic block diagram illustrating an example of an electronic device system according to exemplary embodiments of the present disclosure.

Referring to FIG. 1, an electronic device 1000 may accommodate a motherboard 1010 therein. The motherboard 1010 may include chip related components 1020, network related components 1030, other components 1040 and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory or the like; an application processor chip such as a central processor (for example, a central processing unit (CPU)), a graphics processor (for example, a graphics processing unit (GPU)), a digital signal processor, a cryptographic processor, a microprocessor, a microcontroller or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols and/or any other wireless and wired protocols designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC) and/or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the motherboard 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated) and/or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component or the like. However, the electronic device 1000 is not limited thereto, and may be any other electronic device processing data.

Figure 2:
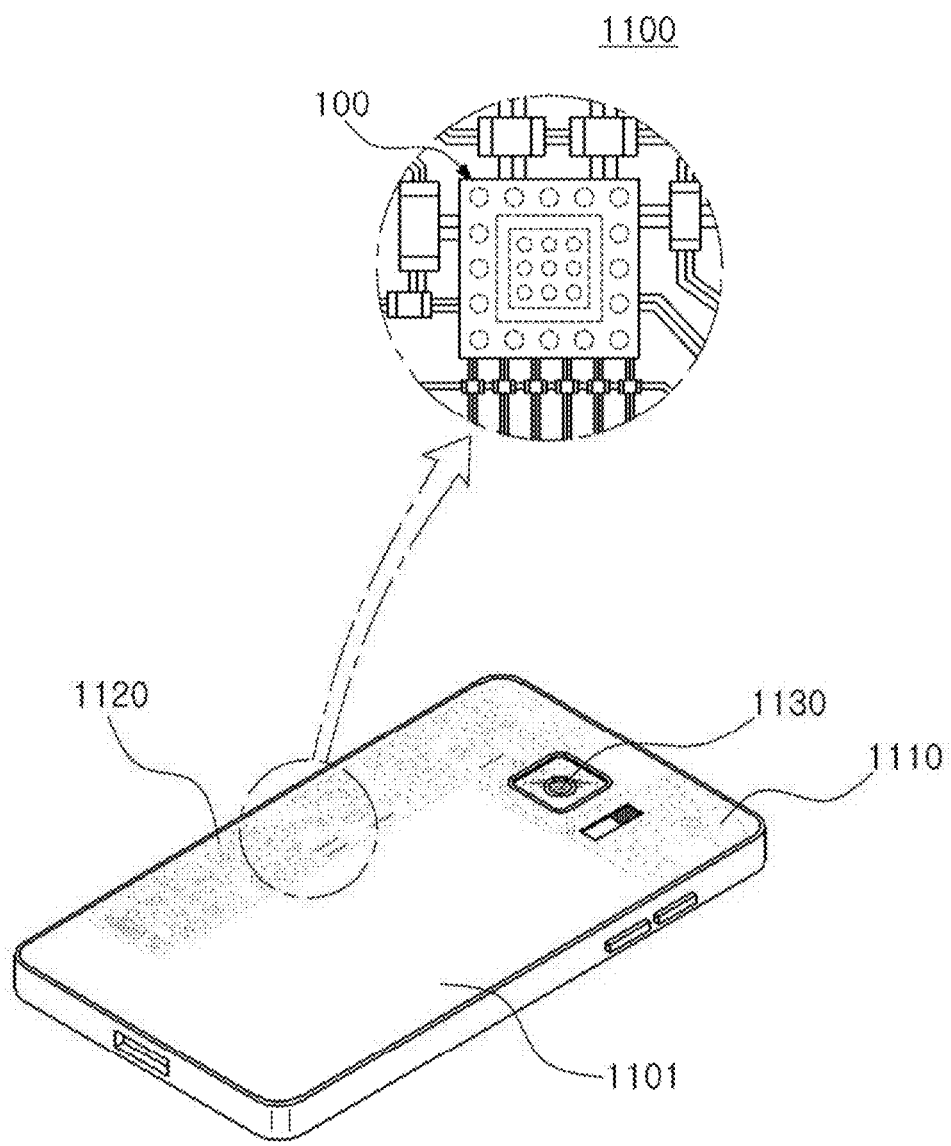
FIG. 2 is a perspective view illustrating an example of an electronic device according to exemplary embodiments of the present disclosure.

FIG. 2 is a perspective view illustrating an example of an electronic device according to exemplary embodiments of the present disclosure.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, and may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical impacts or chemical interactions. Therefore, the semiconductor chip itself may not be used, but may be packaged and used in an electronic device, or the like, in a packaged state.

Here, semiconductor packaging is required due to the existence of a difference in circuit widths between the semiconductor chip and a main board of the electronic device in terms of electrical connections. In detail, a size of connection pads of the semiconductor chip and an interval between the connection pads of the semiconductor chip are very fine, or small, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in circuit widths between the semiconductor chip and the main board is required.

A semiconductor package manufactured using the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3:
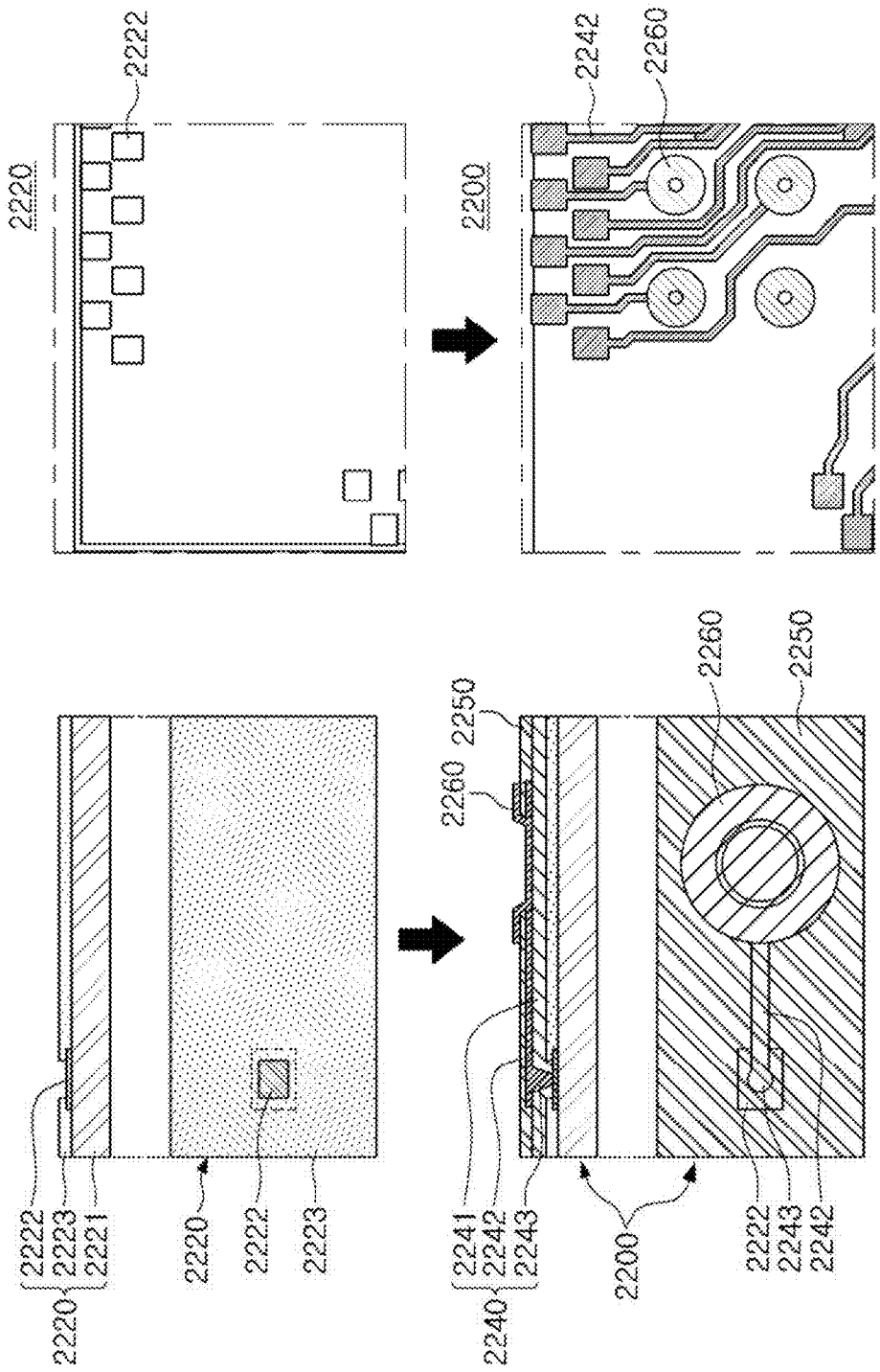
FIGS. 3A and 3B are cross-sectional views illustrating states of a fan-in semiconductor package before and after being packaged according to exemplary embodiments of the present disclosure.

FIGS. 3A and 3B are cross-sectional views illustrating states of a fan-in semiconductor package before and after being packaged according to exemplary embodiments of the present disclosure.

Figure 4:
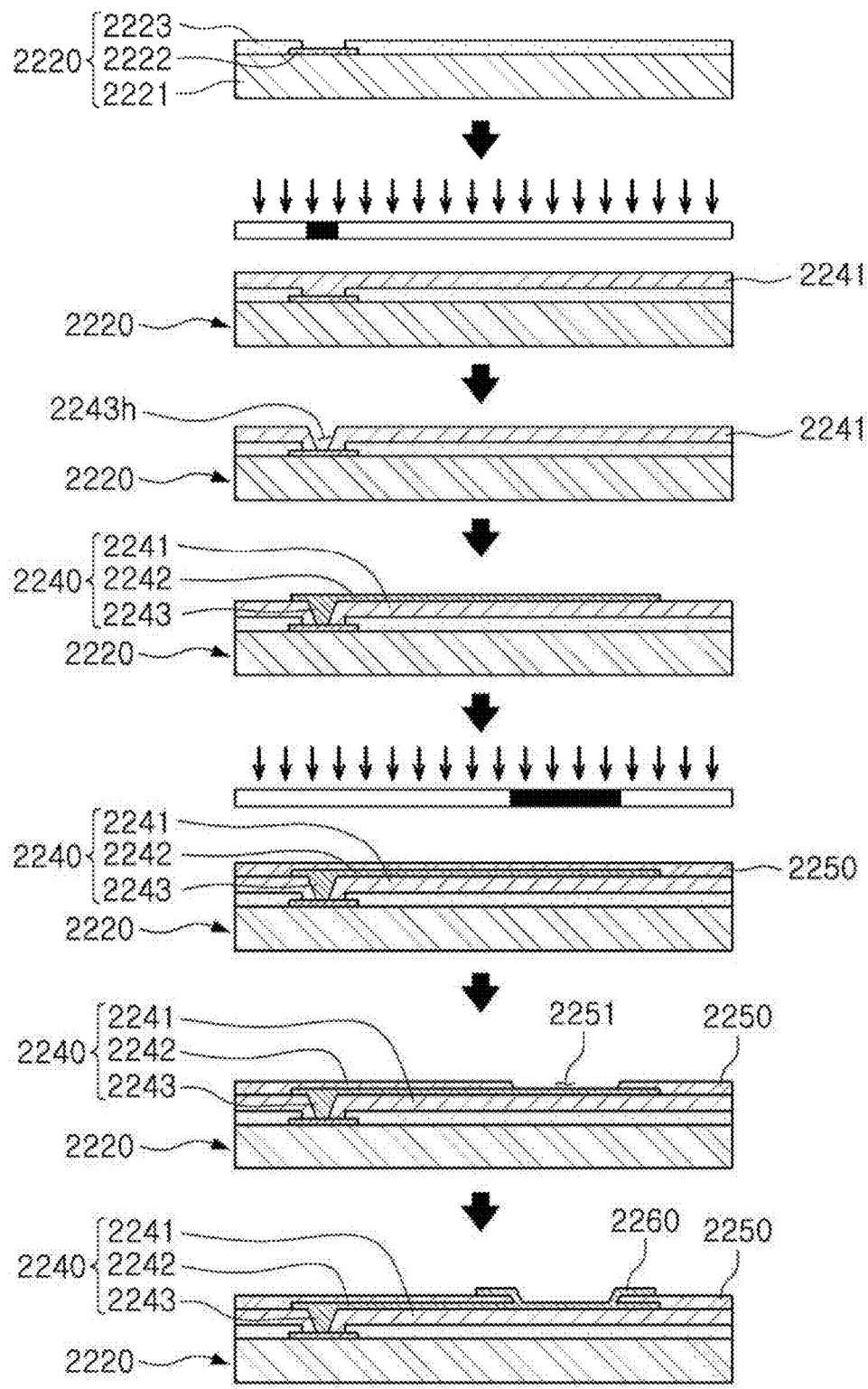
FIG. 4 illustrates a packaging process of a fan-in semiconductor package according to exemplary embodiments of the present disclosure.

FIG. 4 illustrates a packaging process of a fan-in semiconductor package according to exemplary embodiments of the present disclosure.

Referring to the drawings, a semiconductor chip 2220 may be, for example, an integrated circuit (IC) in a bare state, including a body 2221 including silicon (Si), germanium (Ge), gallium arsenide (GaAs) or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the main board of the electronic device, or the like.

Therefore, a connection member 2240 may be formed on the semiconductor chip 2220, depending on a size of the semiconductor chip 2220, in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250 and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a significant spatial limitation. Therefore, it is difficult to apply this structure to a semiconductor chip having a large number of I/O terminals or a semiconductor chip having a compact size. In addition, due to the disadvantages described above, the fan-in semiconductor package may not be directly mounted and used on the main board of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
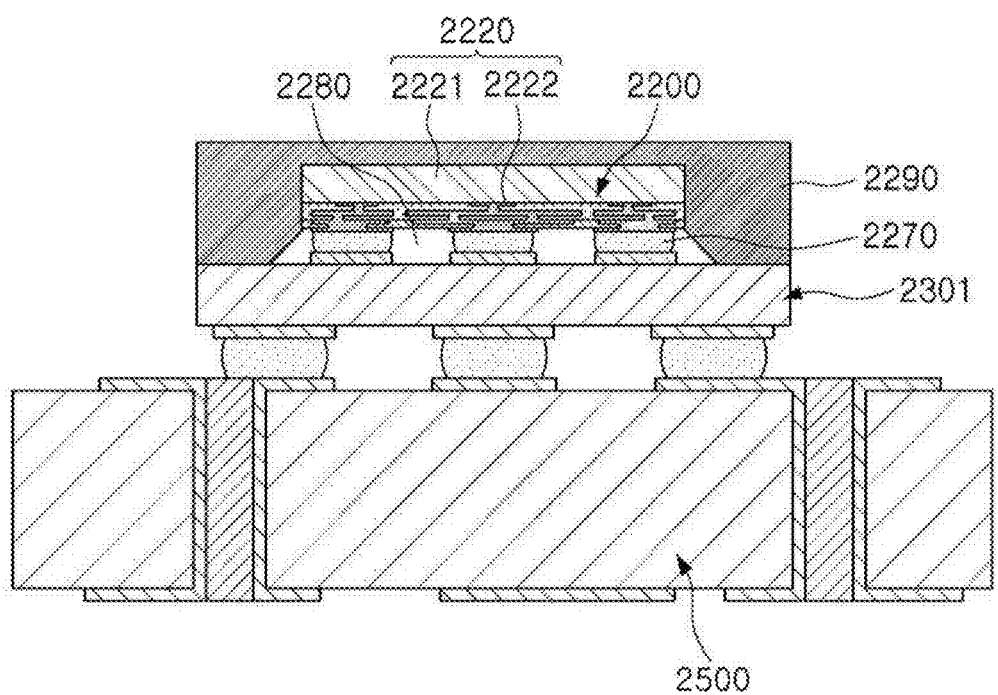
FIG. 5 is a cross-sectional view illustrating a case in which a fan-in semiconductor package is mounted on an interposer substrate and is ultimately mounted on a main board of an electronic device according to exemplary embodiments of the present disclosure.

FIG. 5 is a cross-sectional view illustrating a case in which a fan-in semiconductor package is mounted on an interposer substrate and is ultimately mounted on a main board of an electronic device according to exemplary embodiments of the present disclosure.

Figure 6:
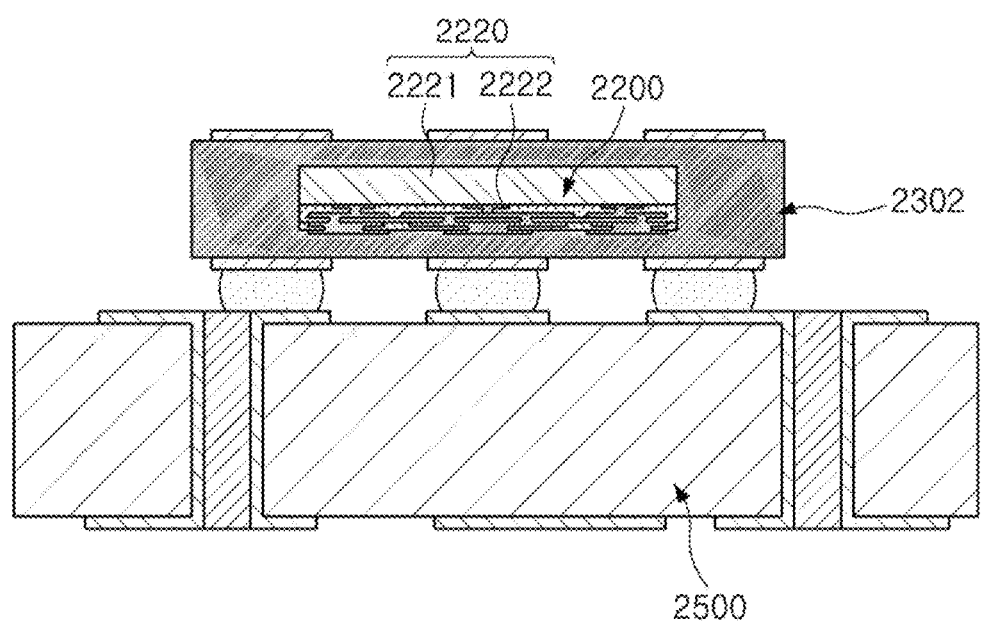
FIG. 6 is a cross-sectional view illustrating a case in which a fan-in semiconductor package is embedded in an interposer substrate and is ultimately mounted on a main board of an electronic device according to exemplary embodiments of the present disclosure.

FIG. 6 is a cross-sectional view illustrating a case in which a fan-in semiconductor package is embedded in an interposer substrate and is ultimately mounted on a main board of an electronic device according to exemplary embodiments of the present disclosure.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and then mounted on the main board of the electronic device through a packaging process or may be mounted and used on the main board of the electronic device in a state in which it is embedded in the interposer substrate.

Fan-Out Semiconductor Package

Figure 7:
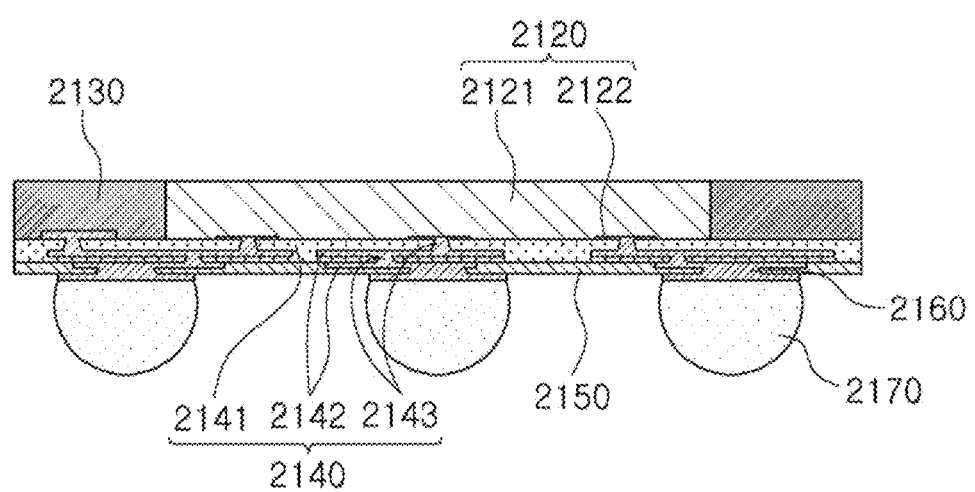
FIG. 7 is a cross-sectional view illustrating a fan-out semiconductor package according to exemplary embodiments of the present disclosure.

FIG. 7 is a cross-sectional view illustrating a fan-out semiconductor package according to exemplary embodiments of the present disclosure.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
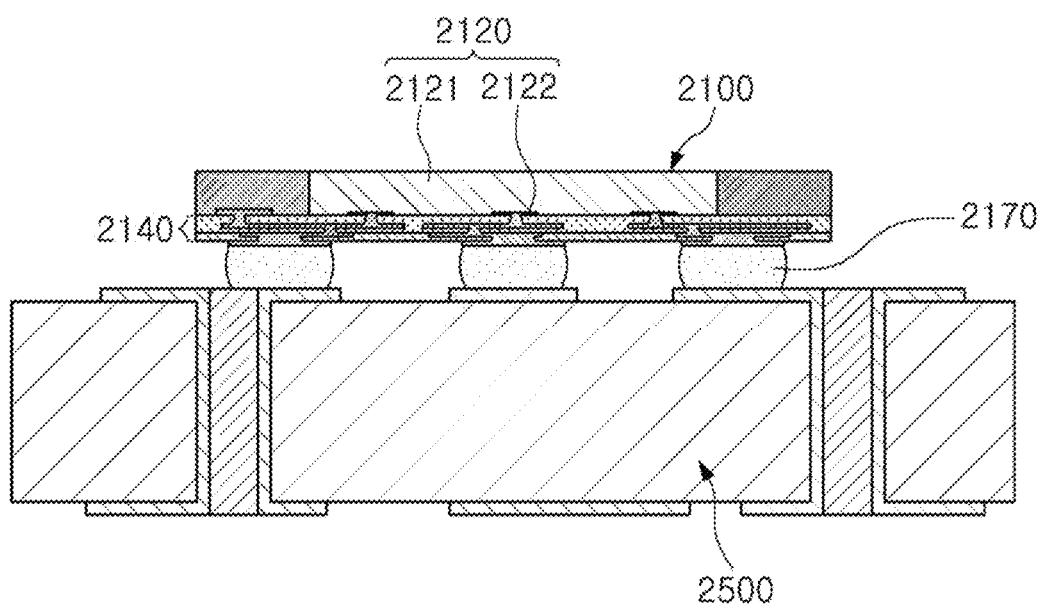
FIG. 8 is a cross-sectional view illustrating a case in which a fan-out semiconductor package is mounted on a main board of an electronic device according to exemplary embodiments of the present disclosure.

FIG. 8 is a cross-sectional view illustrating a case in which a fan-out semiconductor package is mounted on a main board of an electronic device according to exemplary embodiments of the present disclosure.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region having a greater area than that of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate.

As described above, since the fan-out semiconductor package may be mounted on the main board of the electronic device without using the separate interposer substrate, the fan-out semiconductor package may be implemented to have a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile device. Therefore, the fan-out semiconductor package may be implemented in a form more compact than that of a general package-on-package (POP) type using a printed circuit board (PCB), and may solve a problem occurring due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is conceptually different from a printed circuit board (PCB) such as an interposer substrate, or the like, having a scale, a purpose, and the like, different from those of the fan-out semiconductor package, and having the fan-in semiconductor package embedded therein.

A fan-out semiconductor package in which a sufficient number of connection terminals such as solder balls may be secured, in spite of including a passive component, a signal distance between a semiconductor chip and the passive component may be significantly reduced, and thinness is possible will hereinafter be described with reference to the drawings.

Figure 9:
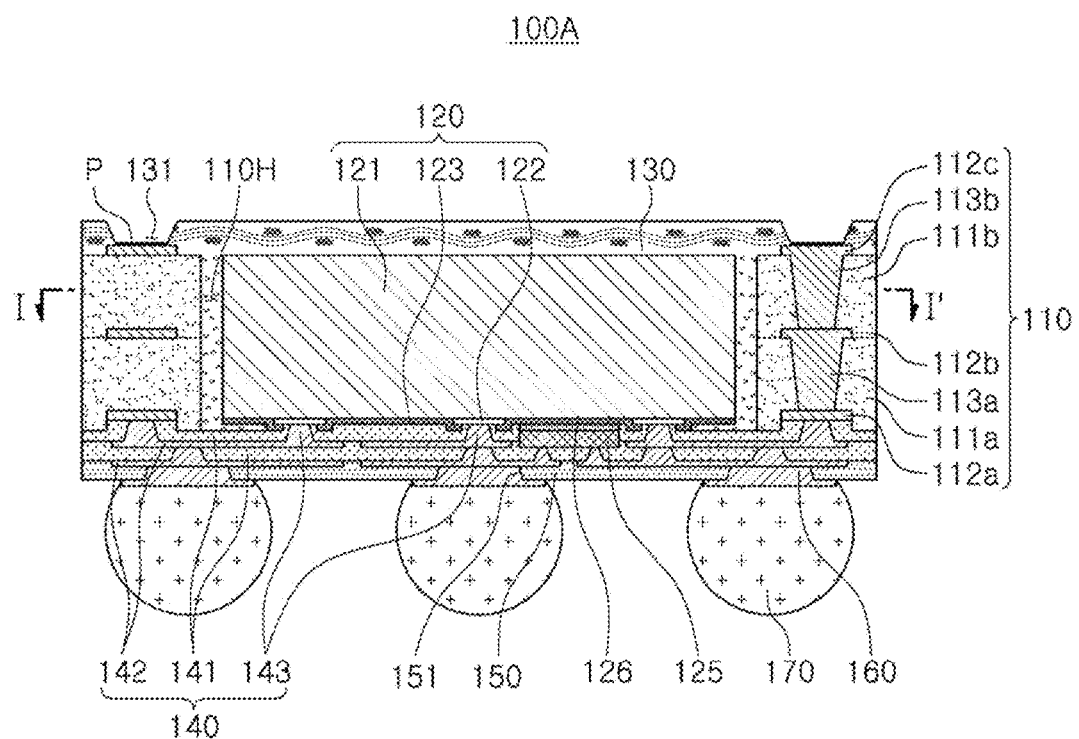
FIG. 9 is a cross-sectional view illustrating an example of a fan-out semiconductor package according to exemplary embodiments of the present disclosure.

FIG. 9 is a cross-sectional view illustrating an example of a fan-out semiconductor package according to exemplary embodiments of the present disclosure.

Figure 10:
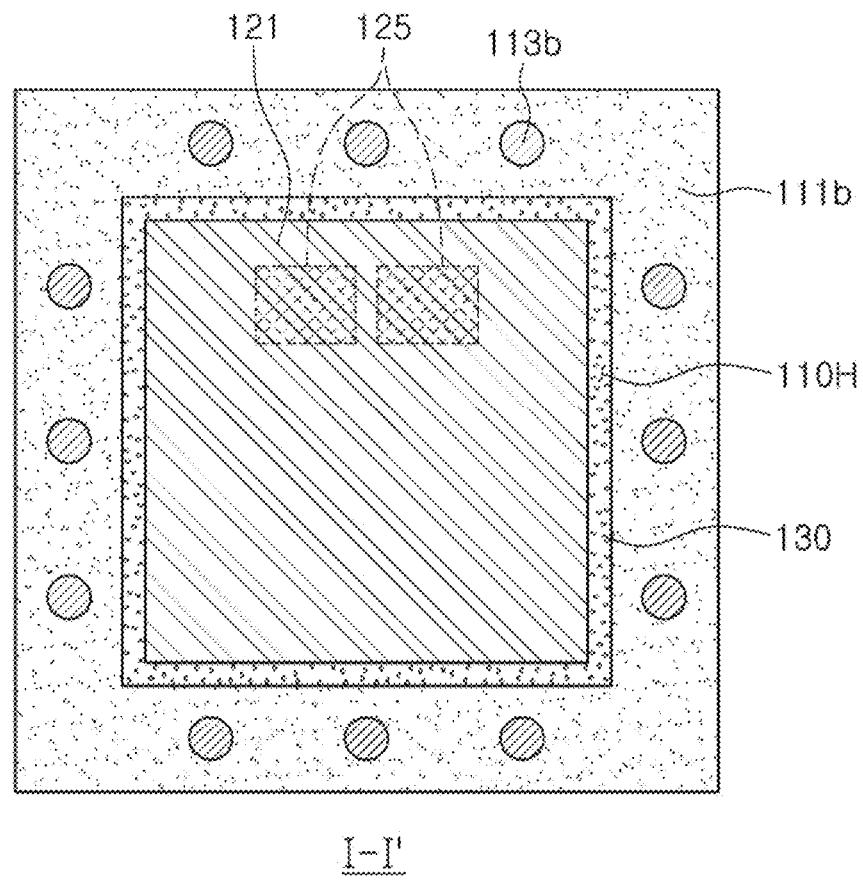
FIG. 10 is a plan view taken along line I-I' of the fan-out semiconductor package of FIG. 9.

FIG. 10 is a plan view taken along line I-I' of the fan-out semiconductor package of FIG. 9.

Referring to the drawings, a fan-out semiconductor package 100A according to exemplary embodiments of the present disclosure may include a first connection member 110 having a through-hole 110H, a semiconductor chip 120 disposed in the through-hole 110H of the first connection member 110 and having an active surface having connection pads 122 disposed thereon and an inactive surface opposing the active surface, passive components 125 attached to the active surface of the semiconductor chip 120, an encapsulant 130 encapsulating at least portions of the first connection member 110 and the inactive surface of the semiconductor chip 120, and a second connection member 140 disposed on the first connection member 110 and the active surface of the semiconductor chip 120. The first connection member 110 may include redistribution layers 112a, 112b and 112c electrically connected to the connection pads 122 of the semiconductor chip 120. The second connection member 140 may also include redistribution layers 142 electrically connected to the connection pads 122 of the semiconductor chip 120. The passive components 125 may be electrically connected to the connection pads 122 of the semiconductor chip 120 through the redistribution layers 142 of the second connection member 140. The passive component 125 may be attached to the semiconductor chip 120 through an adhesive member 126. A passivation layer 150 may further be disposed on the second connection member 140 if necessary, an underbump metal layer 160 may further be disposed in openings 151 of the passivation layer 150, if necessary, and connection terminals 170 such as solder balls, or the like, may further be disposed on the underbump metal layer 160, if necessary.

In general, as expensive electronic devices such as premium smartphones, and the like, use a package-on-package (POP) structure in which a memory package is stacked on an application process (AP) package in order to improve electrical characteristics and efficiently utilize a space, the expensive electronic devices have included passive elements. For example, a manner of embedding the passive element in an interposer substrate for the AP package or mounting the passive element on a lower surface of the interposer substrate for the AP package has been adopted, and a demand for mounting of the passive element will be continuously increased in accordance with improvement of characteristics of an AP and a demand for a reduction in an area thereof.

Meanwhile, a multilayer ceramic capacitor (MLCC), a low inductance chip capacitor (LICC) or the like, has been mainly adopted as the passive component mounted in the AP package, and requirements for a capacity and a thickness of the mounted passive component have increased in order to improve characteristics. In this case, a thousand or more solder balls are generally attached to the lower surface of the interposer substrate of the AP package. Therefore, when the passive component is mounted in the AP package, a limitation may be generated in securing a space in which the solder balls are to be mounted. In addition, a signal transfer distance between the AP and the passive component is significantly long, and a limitation may thus be generated in improving electrical characteristics. Even though the passive component is introduced into the interposer substrate of the AP package, a thickness of the interposer substrate is significantly great, and thus, there is a limitation in promoting, or achieving, thinness of a package.

On the other hand, in the fan-out semiconductor package 100A according to exemplary embodiments of the present disclosure, the semiconductor chip 120 may be packaged in a state in which the passive components 125 are attached to the active surface of the semiconductor chip 120 on which the connection pads 122 of the semiconductor chip 120 are disposed. In detail, after the passive components 125 having electrode pads may be attached to a passivation layer 123 on the active surface of the semiconductor chip 120 through the adhesive member 126, the second connection member 140 including the redistribution layers 142 that may redistribute the connection pads 122 up to a fan-out region may be directly formed on the active surface of the semiconductor chip 120, instead of omission of the interpose substrate. Therefore, a limitation may not be generated in a space in which the connection terminals 170 such as solder balls, or the like, are mounted, and particularly, the passive components 125 may be in a state in which they are closely adhered to the semiconductor chip 120, and the interposer substrate may be omitted to thus promote a significant reduction in a signal distance and thinness of the fan-out semiconductor package.

Meanwhile, in the fan-out semiconductor package 100A according to exemplary embodiments of the present disclosure, the first connection member 110 may include the redistribution layers 112a, 112b and 112c that may redistribute the connection pads 122. Therefore, a degree of freedom in a design may be increased, the number of layers of the second connection member 140 may be significantly reduced to thus promote thinness of the fan-out semiconductor package 100A, and a decrease in a yield depending on a defect occurring at the time of forming the second connection member 140 after the semiconductor chip 120 is disposed may be suppressed.

The respective components included in the fan-out semiconductor package 100A according to exemplary embodiments will hereinafter be described in more detail.

The first connection member 110 may include the redistribution layers 112a, 112b and 112c redistributing the connection pads 122 of the semiconductor chip 120 to thus reduce the number of layers of the second connection member 140. If necessary, the first connection member 110 may improve rigidity of the fan-out semiconductor package 100A depending on certain materials, and serve to secure uniformity of a thickness of the encapsulant 130. The fan-out semiconductor package 100A according to exemplary embodiments may be utilized as a package-on-package (POP) type package by the first connection member 110. The first connection member 110 may have the through-hole 110H. The semiconductor chip 120 may be disposed in the through-hole 110H to be spaced apart from the first connection member 110 by a predetermined distance. Side surfaces of the semiconductor chip 120 may be surrounded by the first connection member 110. However, such a form is only an example and may be variously modified to have other forms, and the first connection member 110 may perform another function depending on such a form.

The first connection member 110 may include a first insulating layer 111a in contact with the second connection member 140, a first redistribution layer 112a in contact with the second connection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b and 112c may be electrically connected to the connection pads 122. The first and second redistribution layers 112a and 112b and the second and third redistribution layers 112b and 112c may be electrically connected to each other through first and second vias 113a and 113b penetrating through the first and second insulating layers 111a and 111b, respectively.

When the first redistribution layer 112a is embedded in the first insulating layer 111a, a step generated due to a thickness of the first redistribution layer 112a may be significantly reduced, and an insulating distance of the second connection member 140 may thus become constant. That is, a difference between a distance from the redistribution layer 142 of the second connection member 140 to a lower surface of the first insulating layer 111a and a distance from the redistribution layer 142 of the second connection member 140 to the connection pad 122 of the semiconductor chip 120 may be smaller than a thickness of the first redistribution layer 112a. Therefore, a high density wiring design of the second connection member 140 may be easy.

The lower surface of the first redistribution layer 112a of the first connection member 110 may be disposed on a level above a lower surface of the connection pad 122 of the semiconductor chip 120. In addition, a distance between the redistribution layer 142 of the second connection member 140 and the first redistribution layer 112a of the first connection member 110 may be greater than that between the redistribution layer 142 of the second connection member 140 and the connection pad 122 of the semiconductor chip 120. The reason is that the first redistribution layer 112a may be recessed into the first insulating layer 111a. As described above, when the first redistribution layer 112a is recessed in the first insulating layer 111a, such that the lower surface of the first insulating layer 111a and the lower surface of the first redistribution layer 112a have a step therebetween, a phenomenon in which a material of the encapsulant 130 bleeds to pollute the first redistribution layer 112a may be prevented. The second redistribution layer 112b of the first connection member 110 may be disposed on a level between the active surface and the inactive surface of the semiconductor chip 120. The first connection member 110 may be formed to have a thickness corresponding to that of the semiconductor chip 120. Therefore, the second redistribution layer 112b formed in the first connection member 110 may be disposed on a level between the active surface and the inactive surface of the semiconductor chip 120.

Thicknesses of the redistribution layers 112a, 112b and 112c of the first connection member 110 may be greater than that of the redistribution layer 142 of the second connection member 140. Since the first connection member 110 may have a thickness equal to or greater than that of the semiconductor chip 120, the redistribution layers 112a, 112b and 112c may be formed to have large sizes, depending on a scale of the first connection member 110. On the other hand, the redistribution layers 142 of the second connection members 140 may be formed at relatively small sizes for thinness.

A material of each of the insulating layers 111a and 111b is not particularly limited. For example, an insulating material may be used as the material of each of the insulating layers 111a and 111b. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT) or the like. Alternatively, a PID resin may also be used as the insulating material.

The redistribution layers 112a, 112b and 112c may serve to redistribute the connection pads 122 of the semiconductor chip 120. A material of each of the redistribution layers 112a, 112b and 112c may be a conductive material such as copper (Cu), aluminum (Al), silver (Ag), tin (Sn), gold (Au), nickel (Ni), lead (Pb) titanium (Ti) or alloys thereof. The redistribution layers 112a, 112b and 112c may perform various functions depending on designs of their corresponding layers. For example, the redistribution layers 112a, 112b and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a, 112b and 112c may include via pads, wire pads, connection terminal pads and the like.

Portions of the third redistribution layer 112c may be exposed through openings 131 formed in the encapsulant 130. A surface treatment layer P may be formed on an exposed surface of the third redistribution layer 112c, if necessary. The surface treatment layer P may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL) or the like, but is not limited thereto.

The vias 113a and 113b may electrically connect the redistribution layers 112a, 112b and 112c formed on different layers to each other, resulting in an electrical path in the first connection member 110. A material of each of the vias 113a and 113b may be a conductive material. Each of the vias 113a and 113b may be completely filled with the conductive material, or the conductive material may also be formed along a wall of each of via holes. In addition, each of the vias 113a and 113b may have all of the shapes known in the related art, such as a tapered shape, a cylindrical shape and the like.

When holes for the first vias 113a are formed, some of the pads of the first redistribution layer 112a may serve as a stopper, and it may thus be advantageous in a process that each of the first vias 113a has the tapered shape of which a width of an upper surface is greater than that of a lower surface. In this case, the first vias 113a may be integrated with the pad patterns of the second redistribution layer 112b. In addition, when holes for the second vias 113b are formed, some of the pads of the second redistribution layer 112b may serve as a stopper, and it may thus be advantageous in a process that each of the second vias 113b has the tapered shape of which a width of an upper surface is greater than that of a lower surface. In this case, the second vias 113b may be integrated with the pad patterns of the third redistribution layer 112c.

The semiconductor chip 120 may be an integrated circuit (IC) provided in an amount of several hundreds to several millions of elements, or more, integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller or the like, but is not limited thereto.

The semiconductor chip 120 may be an IC formed on the basis of an active wafer. In this case, a base material of a body 121 may be silicon (Si), germanium (Ge), gallium arsenide (GaAs) or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film or the like, or a double layer of an oxide layer and a nitride layer. A lower surface of the connection pads 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other required positions.

The passive components 125 may be various kinds of passive components. For example, the passive components 125 may be a multilayer ceramic capacitor (MLCC), a low inductance chip capacitor (LICC), an inductor, an integrated passive device (IPD) and the like. The passive component 125 may be the integrated passive device (IPD) for thinness, but is not necessarily limited thereto. A plurality of passive components 125 may be disposed. In this case, the plurality of passive components 125 may be the same as or different from each other. The passive components 125 may be attached to the passivation layer 123 of the semiconductor chip 120 through the adhesive member 126, or the like, and may be embedded in an insulating layer 141 of the second connection member 140. The passive components 125 may be disposed so that the electrode pads thereof are directed toward the redistribution layer 142 of the second connection member 140.

The adhesive member 126 may be any material that may connect the semiconductor chip 120 and the passive component 125 to each other. For example, a die attach film (DAF) or an epoxy adhesive may be used, and the adhesive member 126 may be the DAF, but is not necessarily limited thereto. The adhesive member 126 may be in contact with the passivation layer 123 of the semiconductor chip 120 and the other surface of the passive component 125 opposing one surface of the passive component 125 on which the electrode pads are disposed, and may connect the semiconductor chip 120 and the passive component 125 to each other.

The encapsulant 130 may protect the first connection member 110, the semiconductor chip 120 and the like. An encapsulation form of the encapsulant 130 is not particularly limited, but may be a form in which the encapsulant 130 surrounds at least portions of the first connection member 110, the semiconductor chip 120, and the like. For example, the encapsulant 130 may cover the first connection member 110 and the inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the second connection member 140. Meanwhile, the encapsulant 130 may fill the through-hole 110H to thus serve as an adhesive and reduce buckling of the semiconductor chip 120 depending on certain materials.

The encapsulant 130 may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin or the like. In addition, the known molding material such as an epoxy molding compound (EMC), or the like, may also be used. Alternatively, a material in which an insulating resin such as a thermosetting resin or a thermoplastic resin is impregnated in an inorganic filler and/or a core material such as a glass fiber (or a glass cloth or a glass fabric) may also be used as the insulating material.

When a material including a glass fiber, an inorganic filler, and an insulating resin is used as the material of the encapsulant 130, warpage of the fan-out semiconductor package 100A may be effectively controlled without performing an additional process. In detail, the encapsulant 130 may include the glass fiber to maintain rigidity of the fan-out semiconductor package 100A. In addition, the encapsulant 130 may include the inorganic filler, and a coefficient of thermal expansion (CTE) may thus be adjusted. Therefore, occurrence of the warpage of the fan-out semiconductor package 100A due to mismatch between CTEs may be suppressed.

A material of the encapsulant 130 may encapsulate the first connection member 110 and the semiconductor chip 120 in a b-stage. Therefore, the insulating resin and the inorganic filler of the encapsulant 130 may be disposed in the spaces between the walls of the through-hole 110H and the side surfaces of the semiconductor chip 120 as well as on the first connection member 110 and the inactive surface of the semiconductor chip 120. On the other hand, the glass fiber of the encapsulant 130 may be disposed only on the first connection member 110 and the inactive surface of the semiconductor chip 120, and rigidity of the fan-out semiconductor package 100A at an upper portion of the fan-out semiconductor package 100A may be maintained by such a disposition of the glass fiber.

The second connection member 140 may redistribute the connection pads 122 of the semiconductor chip 120. Several tens to several hundreds of connection pads 122 of the semiconductor chip 120 having various functions may be redistributed by the second connection member 140, and may be physically or electrically connected to an external source through the connection terminals 170 depending on the functions. The second connection member 140 may include insulating layers 141, the redistribution layers 142 disposed on the insulating layers 141, and vias 143 penetrating through the insulating layers 141 and connecting the redistribution layers 142 to each other. The second connection member 140 may be formed of a single layer, or may be formed of a plurality of layers of which the number is greater than that illustrated in the drawings.

A material of each of the insulating layers 141 may be an insulating material. In this case, a photosensitive insulating material such as a PID resin may also be used as the insulating material. That is, the insulating layer 141 may be a photosensitive insulating layer. When the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti) or alloys thereof. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include via pads, connection terminal pads, and the like.

A surface treatment layer (not illustrated) may be formed on an exposed surface of the redistribution layer 142, if necessary. The surface treatment layer may be formed by, for example, electrolytic gold plating, electroless gold plating, OSP or electroless tin plating, electroless silver plating, electroless nickel plating/substituted gold plating, DIG plating, HASL or the like, but is not limited thereto.

The vias 143 may electrically connect the redistribution layers 142, the connection pads 122, or the like, formed on different layers to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti) or alloys thereof. Each of the vias 143 may be completely filled with the conductive material, or the conductive material may also be formed along a wall of each of the vias. In addition, each of the vias 143 may have all of the shapes known in the related art, such as a tapered shape, a cylindrical shape and the like.

The passivation layer 150 may protect the second connection member 140 from external physical or chemical damage. The passivation layer 150 may have the openings 151 exposing at least portions of the redistribution layer 142 of the second connection member 140. The number of openings 151 formed in the passivation layer 150 may be several tens to several thousands. The passivation layer 150 may include an insulating resin and an inorganic filler, but may not include a glass fiber. For example, the passivation layer 150 may be formed of ABF, but is not limited thereto.

The underbump metal layer 160 may improve connection reliability of the connection terminals 170 to improve board level reliability of the fan-out semiconductor package 100A. The underbump metal layer 160 may be connected to the redistribution layer 142 of the second connection member 140 exposed through the openings 151 of the passivation layer 150. The underbump metal layer 160 may be formed in the openings 151 of the passivation layer 150 by the known metallization method using the known conductive metal such as a metal, but is not limited thereto.

The connection terminals 170 may be additionally configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto.

The number, an interval, a disposition, or the like of the connection terminals 170 is not particularly limited, and may be sufficiently modified by a person skilled in the art depending on design particulars. For example, the connection terminals 170 may be provided in an amount of several tens to several thousands according to the number of connection pads 122, or may be provided in an amount of several tens to several thousands or more or several tens to several thousands or less. When the connection terminals 170 are solder balls, the connection terminals 170 may cover side surfaces of the underbump metal layer 160 extending onto one surface of the passivation layer 150, and connection reliability may be more excellent.

At least one of the connection terminals 170 may be disposed in a fan-out region. The fan-out region is a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a reduced thickness, and may have price competitiveness.

Meanwhile, although not illustrated in the drawings, a metal thin film may be formed on a wall of the through-hole 110H, if necessary, in order to dissipate heat or block electromagnetic waves. In addition, a plurality of semiconductor chips 120 performing functions that are the same as or different from each other may be disposed in the through-hole 110H, if necessary. In addition, a separate passive component such as an inductor, a capacitor, or the like, may be disposed in the through-hole 110H, if necessary.

Figure 11:
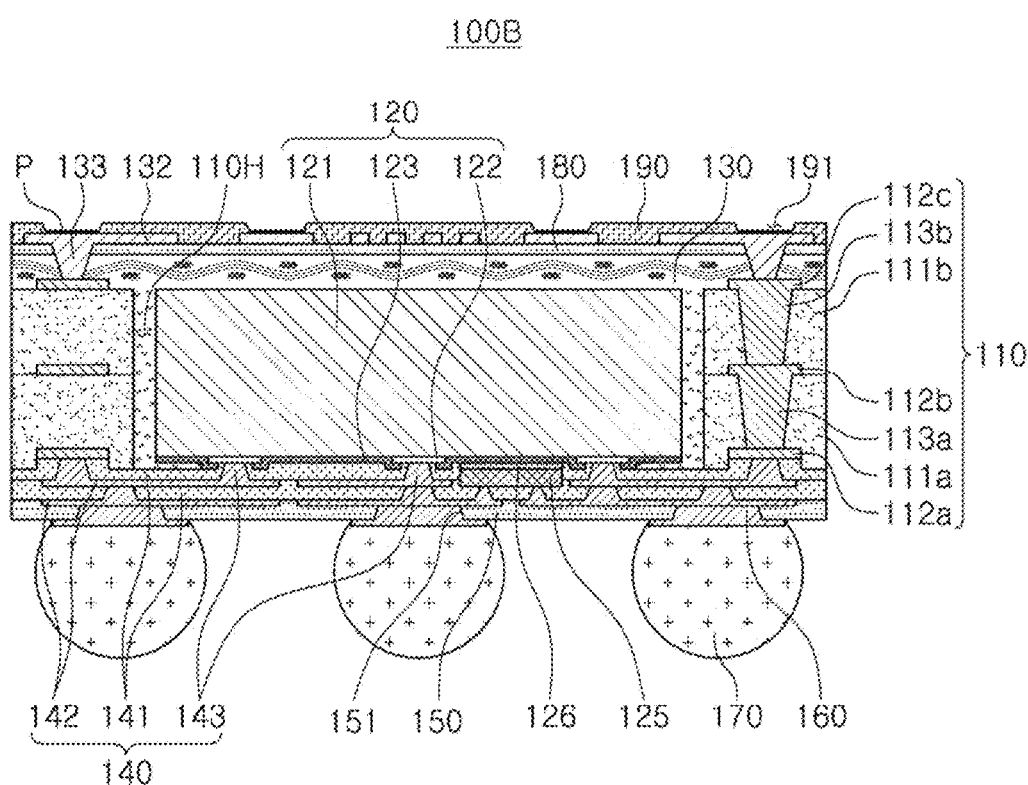
FIG. 11 is a cross-sectional view illustrating an example of a fan-out semiconductor package according to exemplary embodiments of the present disclosure.

FIG. 11 is a cross-sectional view illustrating an example of a fan-out semiconductor package according to exemplary embodiments of the present disclosure.

Referring to the drawing, a fan-out semiconductor package 100B according to exemplary embodiments of the present disclosure may further include a second encapsulant 180 disposed on the first encapsulant 130, a rear redistribution layer 132 disposed on the second encapsulant 180, rear vias 133 penetrating through the first and second encapsulants 130 and 180 and connected to the rear redistribution layer 132 and the third redistribution layer 112c of the first connection member 110, and a second passivation layer 190 disposed on the second encapsulant 180 and having openings 191 exposing at least portions of the rear redistribution layer 132, unlike the fan-out semiconductor package 100A according to the exemplary embodiments described above.

The first encapsulant 130 may be, for example, the prepreg including the glass fiber, the inorganic filler, and the insulating resin as described above, and the second encapsulant 180 may be, for example, ABF, or the like, that includes an inorganic filler and an insulating resin, but does not include a glass fiber, unlike the first encapsulant 130. When the second encapsulant 180 is introduced, openings for the rear vias 133, or the like, may be more easily formed in the first encapsulant 130 in which it is difficult to form openings. The second encapsulant 180 may be relatively thinner than the first encapsulant 130.

The rear redistribution layer 132 may include ground (GND) patterns, power (PWR) patterns, signal (S) patterns and the like, for redistributing the connection pads 122 of the semiconductor chip 120. In addition, the rear redistribution layers 132 may include via pads, wire pads, connection terminal pads and the like. In some case, the rear redistribution layers 132 may include patterns for dissipating heat or blocking electromagnetic interference (EMI). A material of the rear redistribution layer 132 may be a conductive material such as copper (Cu), aluminum (Al), silver (Ag), tin (Sn), gold (Au), nickel (Ni), lead (Pb), titanium (Ti) and/or alloys thereof. A surface treatment layer P may be formed on a surface of the rear redistribution layer 132 exposed through the openings 191 of the second passivation layer 190, if necessary. The surface treatment layer P may be formed by, for example, electrolytic gold plating, electroless gold plating, OSP or electroless tin plating, electroless silver plating, electroless nickel plating/substituted gold plating, DIG plating, HASL, or the like but is not limited thereto.

The rear vias 133 may electrically connect the rear redistribution layer 132, the third redistribution layer 112c, and the like, formed on different layers to each other. A material of each of the rear vias 133 may also be a conductive material. Each of the rear vias 133 may be completely filled with the conductive material, or the conductive material may be formed along a wall of each of via holes. In addition, each of the rear vias 133 may have all of the shapes known in the related art, such as a tapered shape, a cylindrical shape, and the like.

The second passivation layer 190 may protect the rear redistribution layer 132. The second passivation layer 190 may be a photosensitive insulating layer including an inorganic filler and an insulating resin, such as a solder resist layer. Meanwhile, the first passivation layer 150 may be the ABF, or the like, including the inorganic filler and the insulating resin. In this case, a weight percentage of the inorganic filler included in the first passivation layer 150 may be greater than that of the inorganic filler included in the second passivation layer 190. Therefore, entire warpage of the fan-out semiconductor package 100A may be effectively controlled.

A description of other configurations overlaps that described above in the fan-out semiconductor package 100A, and is thus omitted.

Figure 12:
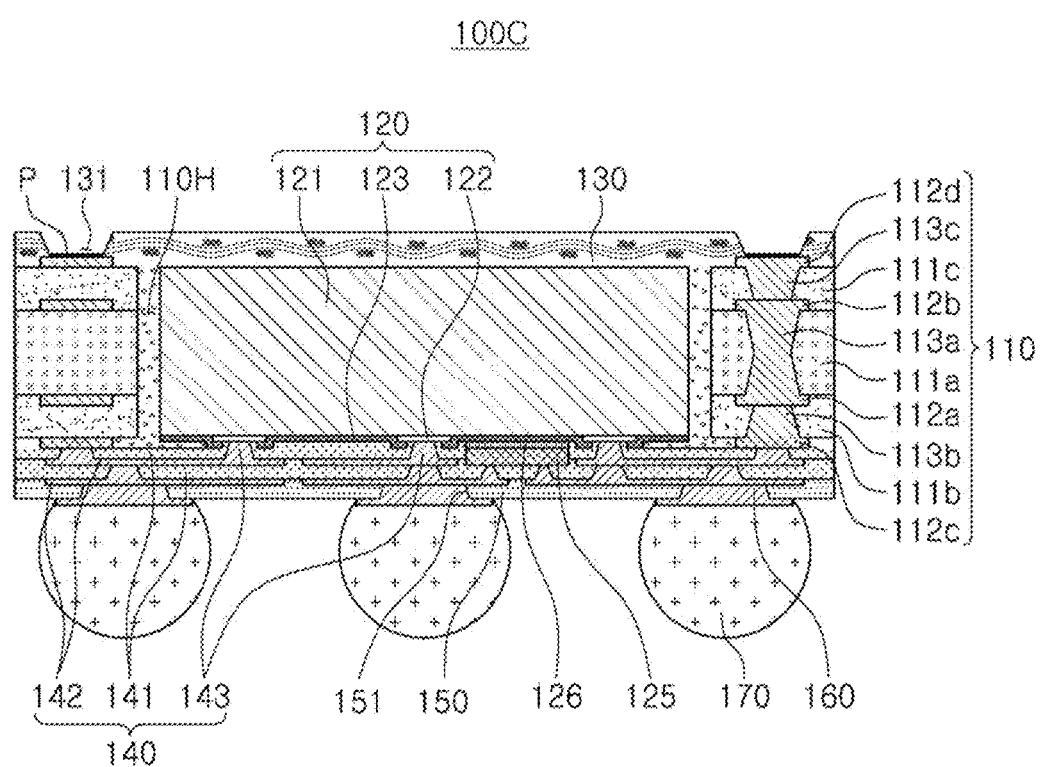
FIG. 12 is a cross-sectional view illustrating an example of a fan-out semiconductor package according to exemplary embodiments of the present disclosure.

FIG. 12 is a cross-sectional view illustrating an example of a fan-out semiconductor package according to exemplary embodiments of the present disclosure.

Referring to the drawing, in a fan-out semiconductor package 100C according to exemplary embodiments of the present disclosure, a first connection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c and 112d may be electrically connected to connection pads 122. Since the first connection member 110 may include a larger number of redistribution layers 112a, 112b, 112c and 112d, a second connection member 140 may further be simplified. Therefore, a decrease in a yield due to defects occurring in a process of forming the second connection member 140 may be suppressed, reduced or eliminated. Meanwhile, the first to fourth redistribution layers 112a, 112b, 112c and 112d may be electrically connected to each other through first to third vias 113a, 113b and 113c each penetrating through the first to third insulating layers 111a, 111b, and 111c.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a glass fiber, an inorganic filler, and an insulating resin, and the second insulating layer 111b and the third insulating layer 111c may be an ABF or a PID film including an inorganic filler and an insulating resin. However, the materials of the first insulating layer 111a and the second and third insulating layers 111b and 111c are not limited thereto. Similarly, the first vias 113a penetrating through the first insulating layer 111a may have a diameter greater than those of second vias 113b and third vias 113c each penetrating through the second insulating layer 111b and the third insulating layer 111c.

A lower surface of the third redistribution layer 112c of the first connection member 110 may be disposed on a level below a lower surface of the connection pad 122 of a semiconductor chip 120. In addition, a distance between a redistribution layer 142 of the second connection member 140 and the third redistribution layer 112c of the first connection member 110 may be smaller than that between the redistribution layer 142 of the second connection member 140 and the connection pad 122 of the semiconductor chip 120. The reason is that the third redistribution layer 112c may be disposed in a protruding form on the second insulating layer 111b, resulting in contacting the second connection member 140. The first redistribution layer 112a and the second redistribution layer 112b of the first connection member 110 may be disposed on a level between an active surface and an inactive surface of the semiconductor chip 120. The first connection member 110 may be formed to have a thickness corresponding to that of the semiconductor chip 120. Therefore, the first redistribution layer 112a and the second redistribution layer 112b formed in the first connection member 110 may be disposed on a level between the active surface and the inactive surface of the semiconductor chip 120.

Thicknesses of the redistribution layers 112a, 112b, 112c and 112d of the first connection member 110 may be greater than those of redistribution layers 142 of the second connection member 140. Since the first connection member 110 may have a thickness equal to or greater than that of the semiconductor chip 120, the redistribution layers 112a, 112b, 112c, and 112d may also be formed to have large sizes. On the other hand, the redistribution layers 142 of the second connection members 140 may be formed at relatively small sizes for thinness.

Portions of the fourth redistribution layer 112d of the first connection member 110 may be exposed through openings 131 formed in an encapsulant 130, and a surface treatment layer P may be formed on an exposed surface of the fourth redistribution layer 112d, if necessary. The surface treatment layer P may be formed by, for example, electrolytic gold plating, OSP or electroless tin plating, electroless silver plating, electroless nickel plating/substituted gold plating, DIG plating, HASL, or the like, but is not limited thereto.

A description of other configurations may overlap those described above in the fan-out semiconductor package 100A, and is thus omitted. Meanwhile, the features of the fan-out semiconductor package 100B described above may also be applied to the fan-out semiconductor package 100C.

As set forth above, according to exemplary embodiments of the present disclosure, a fan-out semiconductor package in which a sufficient number of connection terminals such as solder balls may be secured, in spite of including a passive component, a signal distance between a semiconductor chip and the passive component may be significantly reduced and component thinness may be realized.

While exemplary embodiments have been shown and described above, it will be apparent to those skilled in the art that modifications and variations could be made without departing from the scope of the present disclosure as defined by the appended claims.

What is claimed is:

1. A fan-out semiconductor package, comprising:
a first connection member having a through-hole;
a semiconductor chip disposed in the through-hole of the first connection member, the semiconductor chip including an active surface having connection pads disposed thereon and an inactive surface opposing the active surface;
a passive component attached to the active surface of the semiconductor chip;
an encapsulant encapsulating at least a portion of the first connection member and the inactive surface of the semiconductor chip; and
a second connection member disposed on the first connection member and the active surface of the semiconductor chip, the first connection member and the second connection member each including at least one redistribution layer electrically connected to the connection pads of the semiconductor chip, and the passive component being electrically connected to the connection pads of the semiconductor chip through the redistribution layer of the second connection member.

2. The fan-out semiconductor package of claim 1, wherein the semiconductor chip includes a passivation layer disposed on the active surface, the passivation layer covering at least a portion of the connection pads, and
the passive component being attached to the passivation layer through an adhesive member.

3. The fan-out semiconductor package of claim 2, wherein the passive component includes an integrated passive device (IPD) having a first surface with electrode pads disposed thereon and a second surface opposing the first surface, and
the electrode pads disposed on the first surface of the IPD being connected to the redistribution layer of the second connection member, and the second surface of the IPD being in contact with the adhesive member.

4. The fan-out semiconductor package of claim 2, wherein the adhesive member is a die attach film (DAF) or an epoxy adhesive.

5. The fan-out semiconductor package of claim 1, wherein the encapsulant is a first encapsulant including a glass fiber, an inorganic filler and an insulating resin.

6. The fan-out semiconductor package of claim 5, further comprising a second encapsulant disposed on the first encapsulant,
wherein the second encapsulant includes an inorganic filler and an insulating resin.

7. The fan-out semiconductor package of claim 6, further comprising:
a rear redistribution layer disposed on the second encapsulant; and
rear vias penetrating through the first and second encapsulants and connected to the rear redistribution layer and the redistribution layer of the first connection member.

8. The fan-out semiconductor package of claim 7, further comprising a first passivation layer disposed on the second connection member and having first openings exposing at least portions of the redistribution layer of the second connection member; and
a second passivation layer disposed on the second encapsulant and having second openings exposing at least portions of the rear redistribution layer,
wherein the first and second passivation layers include inorganic fillers and insulating resins, respectively, and
a weight percentage of the inorganic filler included in the first passivation layer is greater than that of the inorganic filler included in the second passivation layer.

9. The fan-out semiconductor package of claim 1, wherein the first connection member includes a first insulating layer, a first redistribution layer in contact with the second connection member and embedded in the first insulating layer, and a second redistribution layer disposed on another surface of the first insulating layer opposing one surface of the first insulating layer in which the first redistribution layer is embedded.

10. The fan-out semiconductor package of claim 9, wherein the first connection member further includes a second insulating layer disposed on the first insulating layer and covering the second redistribution layer and a third redistribution layer disposed on the second insulating layer.

11. The fan-out semiconductor package of claim 9, wherein a distance between the redistribution layer of the second connection member and the first redistribution layer is greater than a distance between the redistribution layer of the second connection member and the connection pad of the semiconductor chip.

12. The fan-out semiconductor package of claim 1, wherein the first connection member includes a first insulating layer, a first redistribution layer and a second redistribution layer disposed on opposite surfaces of the first insulating layer, respectively, a second insulating layer disposed on the first insulating layer and covering the first redistribution layer, and a third redistribution layer disposed on the second insulating layer.

13. The fan-out semiconductor package of claim 12, wherein the first connection member further includes a third insulating layer disposed on the first insulating layer and covering the second redistribution layer and a fourth redistribution layer disposed on the third insulating layer.

14. The fan-out semiconductor package of claim 12, wherein the first insulating layer has a thickness greater than that of the second insulating layer.

15. A fan-out semiconductor package, comprising:
a semiconductor chip including a body having first and second surfaces opposing each other, connection pads disposed on the first surface of the body, and a passivation layer disposed on the first surface of the body and covering at least a portion of the connection pads;
an integrated passive device (IPD) including a body having third and fourth surfaces opposing each other and electrode pads disposed on the third surface;
a die attach film (DAF) connecting the passivation layer of the semiconductor chip and the fourth surface of the IPD;
an encapsulant encapsulating at least a portion of the semiconductor chip; and
a connection member disposed on the semiconductor chip and including a redistribution layer electrically connected to the connection pads of the semiconductor chip and the electrode pads of the IPD.

* * * * *